(12) United States Patent
Kuyel

(10) Patent No.: US 6,640,193 B2
(45) Date of Patent: Oct. 28, 2003

(54) METHOD AND SYSTEM FOR MEASURING JITTER

(75) Inventor: Turker Kuyel, Dallas, TX (US)

(73) Assignee: Texas Instruments Incorporated, Dallas, TX (US)

(*) Notice: Subject to any disclaimer, the term of this patent is extended or adjusted under 35 U.S.C. 154(b) by 133 days.

(21) Appl. No.: 09/731,433

(22) Filed: Dec. 6, 2000

(65) Prior Publication Data

US 2002/0103609 A1 Aug. 1, 2002

Related U.S. Application Data

(60) Provisional application No. 60/171,260, filed on Dec. 15, 1999.

(51) Int. Cl.[7] ................................................ G06F 19/00
(52) U.S. Cl. .............................. 702/69; 702/32; 702/57; 702/106; 714/751; 714/758; 375/226; 375/227; 370/516; 370/503; 340/310.03; 340/146.2; 324/613; 324/620
(58) Field of Search ........................ 702/32, 57, 69–71, 702/74, 81, 82, 84, 85, 106, 112, 124–126, 189, 190; 324/600, 613–626, 76.19, 76.24, 76.38; 370/516, 503, 506, FOR 177, FOR 185; 375/226, 224, 227, 228; 714/751, 748, 746, 752, 758–762, 764, 765

(56) References Cited

U.S. PATENT DOCUMENTS

| 4,542,514 A | * | 9/1985 | Watanabe ................... 375/10 |
| 5,754,437 A | * | 5/1998 | Blazo ........................ 364/484 |
| 6,240,130 B1 | * | 5/2001 | Burns et al. ................ 375/226 |

OTHER PUBLICATIONS

Fulton et al., "Delay Jitter First–Order and Second Order Statistical Functions of General Traffic on High–Speed Multimedia Networks" Jan. 1998, IEEE/ACM, No. 2, vol. 6, pp. 150–163.*

(List continued on next page.)

Primary Examiner—Marc S. Hoff
Assistant Examiner—Elias Desta
(74) Attorney, Agent, or Firm—Frederick J. Telecky, Jr.; W. James Brady, III

(57) ABSTRACT

According to one embodiment of the present invention, a system (100) for measuring overall jitter is disclosed that includes a data converter (102) that measures a signal to generate a first measurement set (212) and a second measurement set (214), which are used to compute overall jitter. According to one embodiment of the present invention, a method for measuring overall jitter is disclosed. The data converter (102) generates the first measurement set (212) and the second measurement set (214) by measuring the signal. The overall jitter is computed using the measurement sets (212 and 214). According to one embodiment of the present invention, a system (400) for measuring internal jitter is disclosed that includes a splitter (404) that splits a signal into an input signal (406) and a clock signal (410). The data converter (102) measures the input signal (406) to generate a first data set and a second data set, which are used to compute the internal jitter of the data converter (102). According to one embodiment of the present invention, a method for measuring internal jitter is disclosed. A signal is split into an input signal (406) and a clock signal (410). The data converter (102) measures the input signal to generate the first data set (508) and the second data set (512). The internal jitter is computed using the first data set (508) and the second data set (512). The external jitter is computed from the overall and internal jitter. The signal-to-noise ratio of the data converter (102) is computed from the external jitter.

22 Claims, 3 Drawing Sheets

OTHER PUBLICATIONS

Rosing et al., "Off–Chip Diagnosis of Aperture Jitter in Full–flash Analog–to–Digital Converters", Feb., 1999, JETTA, pp. 1–8.*

Drexel, "The Square Wave in Detail" Jun. 1996, The Math Forum, pp. 1–3.*

L.B. Page, "Probability for Engineering, with Applications to Reliability" 1989, Computer Science Press, pp. 73–75.*

LeCroy Digital Oscilloscopes, "Accuracy in Time Jitter Measurements with LeCroy Oscilloscopes", LeCroy Corporation, 1–6.

Aeroflex Comstron Inc., "PN9000 Automated Phase Noise Measurement System," Comstron, 1–19.

Aeroflex Comstron Inc., "Phase Noise Theory and Measurement," Application Note, Comstron, 1–36.

Wavecrest Corporation, "Digital Time Systems," Wavecrest, 1–5.

* cited by examiner

METHOD AND SYSTEM FOR MEASURING JITTER

This application claims priority under 35 USC §119(e)(1) of provisional application No. 60/171,260 filed Dec. 15, 1999.

TECHNICAL FIELD OF THE INVENTION

This invention relates generally to the field of electronic circuits and more specifically to a method and system for measuring jitter.

BACKGROUND OF THE INVENTION

The growing use of data converters has created a demand for more accurate and more precise methods for measuring jitter. Sampling time noise, or jitter, is a component of signal-to-noise ratio (SNR), which is an important parameter in assessing the performance of a data converter. Jitter causes deviations in the sampling time, which in turn causes deviations in the value of the signal sample. Jitter becomes a major factor in the SNR at relatively high input frequencies, for example, the frequencies at which communications analog-to-digital converters (ADCs) operate, because even a small deviation in the sampling time may result in a large deviation in the value of the signal sample. As the demand for intermediate frequency sampling in communication systems increases, ADC manufacturers are faced with the task of measuring the SNR at very high input frequencies. The SNR at high input frequencies may be measured using a test system with very low jitter. Even state-of-the-art test systems, however, cannot meet the low jitter requirement. Alternatively, the SNR may be measured using test systems with medium jitter by measuring the jitter of the system and then calibrating out the jitter. Known methods and systems of measuring jitter, however, have not been completely satisfactory in terms of accuracy, precision, and speed.

Calculation of the maximum jitter tolerance for a data converter begins with computing the SNR. Theoretically, the best possible SNR of an N-bit converter, assuming that the input is uniformly distributed between two adjacent data converter codes, is given by Equation (1):

$$SNR\max(dBs) = 6.02N \sim 6N \qquad (1)$$

Practically, the measured SNR of a data converter may be worse than the above prediction due to various factors, including jitter. Overall jitter may be due to internal factors inside of the data converter such as the aperture jitter of a sample and hold circuit or to external factors such as the jitter of a dock source or the phase noise of an input wave generator. If the amplitude noise due to overall jitter is integrated and the input is a sine wave, Equation (2) describes how overall jitter limits the best SNE of a data converter:

$$SNR\max(dBs) = -20 \log(2\pi f\epsilon) \qquad (2)$$

where f is the input frequency, and $\epsilon$ is the root mean square (mis) value of the overall jitter in the system. Assuming that the jitter induced noise level should be Less than the quantization noise of an ideal converter, Equations (1) and (2) may be equated to yield Equation (3) describing the maximum jitter tolerance a of a data converter:

$$\epsilon < \frac{1}{f * 10^{0.3N} * 2\pi} \qquad (3)$$

According to Equation (3), less than 1 ps rms jitter is tolerated in a 14-bit communication ADC sampling a 70 MHz if signal. This requirement is very stringent considering the fad that the typical jitter found in CMOS digital logic circuits is around 20–30 ps rms. Other maximum jitter tolerance levels are shown in TABLE 1.

TABLE 1

| Maximum Jitter Tolerance for ADCs (ps rms × 2π) | | | | | |
|---|---|---|---|---|---|
| Bits | 8 | 10 | 12 | 14 | 16 |
| Input Frequency: | | | | | |
| 10 KHz | 398107 | 100000 | 10000 | 6309 | 1585 |
| 100 KHz | 39810 | 10000 | 1000 | 631 | 158 |
| 1 MHz | 3981 | 1000 | 100 | 63 | 15.8 |
| 10 MHz | 398 | 100 | 10 | 6.3 | 1.58 |
| 100 MHz | 40 | 10 | 1 | 0.63 | 0.16 |

The stringent low jitter requirement makes the measurement of the SNR of data converters extremely difficult. According to a known approach for measuring the SNR, the SNR is directly measured. This approach requires that the jitter of the system used to measure the SNR of the data converter be much lower than the maximum jitter tolerance level. Low jitter sine wave generators and clock sources, however, are very expensive and often fail to meet the performance requirements needed to measure the SNR of communication ADCs. Moreover, it is difficult to integrate low jitter sine wave generators and clock sources into production testers. In another approach for measuring the SNR, instead of using an ideal clock source or sine wave generator to minimize system jitter, the noise due to system jitter is measured and calibrated out from the overall noise. Such calibration techniques, however, remove the requirement for low jitter hardware at the expense of the need for accurate and precise jitter measurements. For such calibration to work, the accuracy of the jitter measurement has to be much better than the jitter in the test system.

Known methods of measuring jitter include the sampling scope methods, comparator methods, and phase noise methods. According to the sampling scope methods, a clock waveform is digitized at a high speed and the time between the two signals edges is measured. Jitter is computed from the standard deviation of the measurements. A disadvantage of these methods is that the scope timebase must be jitter-free. Moreover, the accuracy of these methods is limited to approximately 10 ps rms, partly due to the insufficient 8-bit resolution of the ADCs used in scopes. The comparator methods use a comparator to trigger at the zero crossings of the clock and start a coarse and a fine counter. The fine counter works by digitizing the discharge voltage of a capacitor. The coarse counter takes the average of multiple measurements of the time between the zero crossings. These methods, however, are slow. Moreover, the accuracy of these methods is limited to approximately 10 ps rms. The phase noise methods measure the phase noise and mathematically relate the phase noise to clock jitter. These methods, however, require a very low phase noise signal generator and a high quality mixer to mix down the fundamental components of the clock frequency to the base band. Moreover, these methods are frequency-based and are very slow.

While these approaches have provided improvements over prior approaches, the challenges in the field of electronic circuits have continued to increase with demands for more and better jitter measurement techniques having greater accuracy and precision. Therefore, a need has arisen for a new method and system for measuring jitter.

SUMMARY OF THE INVENTION

In accordance with the present invention, a method and system for measuring jitter are provided that substantially eliminate or reduce the disadvantages and problems associated with previously developed systems and methods.

According to one embodiment of the present invention, a system for measuring overall jitter is disclosed that comprises a data converter and a signal generator. The signal generator is coupled to the data converter and outputs a signal to the data converter. The data converter measures the signal to generate a first measurement set representing overall jitter and system noise, and to generate a second measurement set representing system noise. The overall jitter is computed using the first measurement set and the second measurement set. More specifically, the overall jitter is computed using the variance of the first measurement set and the variance of the second measurement set.

According to one embodiment of the present invention, a method for measuring overall jitter is disclosed. First, a signal is input into a data converter. Second, a first measurement set representing overall jitter and system noise is generated by measuring the signal. Third, a second measurement set representing system noise is generated by measuring the signal. Finally, the overall jitter is computed using the first measurement set and the second measurement set. More specifically, the overall jitter is computed using the variance of the first measurement set and the variance of the second measurement set.

According to one embodiment of the present invention, a system for measuring internal jitter is disclosed that comprises a signal generator that generates a signal. A splitter coupled to the signal generator splits the signal into an input signal and a clock signal. A data converter coupled to the splitter measures the input signal using the clock signal to generate a first data set representing internal jitter and system noise and to generate a second data set representing system noise. The internal jitter is computable using the first data set and the second data set. More specifically, the internal jitter is computed using the variance of the first data set and the variance of the second data set.

According to one embodiment of the present invention, a method for measuring internal jitter is disclosed. First, a signal is provided. Second, the signal is split into an input signal and a clock signal. Third, the input signal is input into a data converter. Fourth, the clock signal is input into the data converter. Fifth, a first data set representing internal jitter and system noise is generated by measuring the input signal using the data converter. Sixth, a second data set representing system noise is generated by measuring the input signal using the data converter. Finally, the internal jitter is computed using the first data set and the second data set. More specifically, the internal jitter is computed using the variance of the first data set and the variance of the second data set.

A technical advantage of the present invention is that, unlike the measurements of known approaches, the calculation of overall jitter and internal jitter does not include system noise, resulting in a more accurate estimate of jitter, approximately 0.1 ps rms accuracy. The exclusion of system noise also results in more accurate estimate of signal-to-noise ratio. Another technical advantage of the present invention is that the external jitter may be determined using the internal and overall jitter, allowing for a measurement of the jitter of the test system. Another technical advantage of the present invention is that it does not require practically jitterless components to determine the overall jitter and internal jitter of a data converter. Practically jitterless components are often expensive and fail to meet the requirements needed to measure the jitter of a communications data converter. Therefore, the present invention allows for a more accessible, more accurate calculation of jitter. Other technical advantages are readily apparent to one of skill in the art.

BRIEF DESCRIPTION OF THE DRAWINGS

For a more complete understanding of the present invention and for further features and advantages, reference is now made to the following description, taken in conjunction with the accompanying drawings, in which.

DETAILED DESCRIPTION OF THE DRAWINGS

Various embodiments of the present invention and its advantages are best understood by referring to FIGS. 1–6 of the drawings, like numerals being used for like and corresponding parts of the various drawings.

Figure 1:
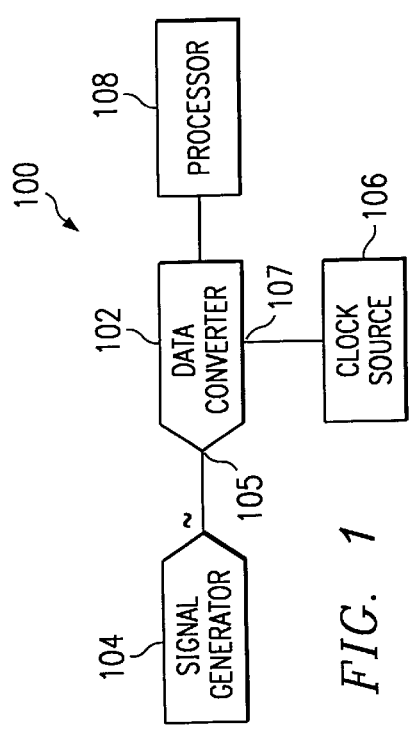
FIG. 1 is a block diagram of one embodiment of a system for measuring overall jitter that may be used in accordance with the present invention.

FIG. 1 is a block diagram of one embodiment of a system 100 for measuring overall jitter that may be used in accordance with the present invention. The system 100 comprises a data converter 102, and a signal generator 104, a clock source 106, and a processor 108, all of which may be coupled to the data converter 102. The overall jitter of the system 100 includes the internal jitter of the data converter 102, the signal generator 104, and the clock source 106. The data converter 102 may be, for example, a high-frequency, high-amplitude, high-SNR analog-to-digital converter (ADC), for example, a ten- to sixteen-bit communication ADC. Time jitter creates a large variation in the output of the data converter 102 when the input has a high frequency and a high amplitude. Thus, a high-frequency, high-amplitude input may be used to improve sensitivity to jitter. Undersampling may be also used to achieve a desired jitter sensitivity. Undersampling occurs when the frequency of an input signal is greater than one-half the sampling frequency.

By using undersampling, the input frequency may be high, while the sampling frequency does not have to be high. Additionally, a converter with a high SNR may also be used to improve jitter sensitivity. For these reasons, ten- to sixteen-bit communication ADCs may provide more jitter sensitivity than the eight-bit ADCs often used in scopes.

The signal generator 104 may be, for example, a low phase noise sine wave generator or square wave generator. The signal generator 104 may be operable to output to the data converter 102 a signal that has maximum slew rate points, points of greatest slope, and minimum slew rate points, points of zero slope. The clock source 106 may be synchronized with the signal generator 104, for example, it may be phase locked with the signal generator 104. The signal from the signal generator 104 may be sent to the input 105 of the data converter 102, and may be used as the signal to be sampled. The signal from the clock source 106 may be sent to the clock 107 of the data converter 102, and may be used to determine which points of the input signal are to be sampled. If the input source has very low jitter, the clock source 106 may be the main source of the jitter. The processor 108 may be used to compute the overall jitter from the output of the data converter 102.

In general, the data converter 102 is operable to generate a first measurement set by sampling the signal at the maximum slew rate points of the signal, and is operable to generate a second measurement set by sampling the signal at the minimum slew rate points of the signal. The overall jitter may then be computed using the first and the second measurement sets.

Figure 2:
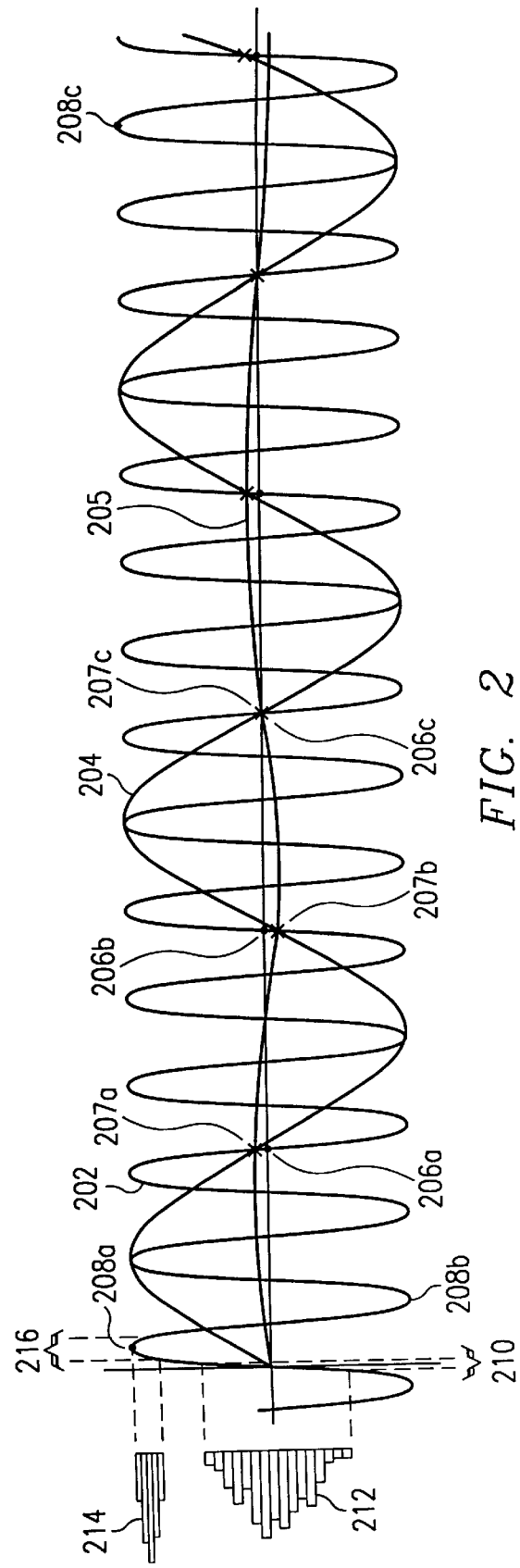
FIG. 2 is a graph illustrating a first measurement set and a second measurement set generated in one embodiment of a method for measuring overall jitter in accordance with the present invention.

FIG. 2 is a graph illustrating a first measurement set and a second measurement set generated in one embodiment of a method for measuring overall jitter in accordance with the present invention. A signal 202 may be an output from the signal generator 104, and a clock signal 204 may be an output from the clock source 106. The output signal 205 from the data converter 102 is formed by the sampling of the signal 202 by the clock signal 204. Note that the output signal 205 may be a sine wave. In this embodiment, the signal 202 and the clock and signal 204 are sine waves. The signal 202 has maximum slew rate points 206a, 206b and 206c, which are the points of greatest slope of the sine wave. The signal 202 also has minimum slew rate points 208a, 208b, and 208c, which are points of zero slope of the sine wave. The signal generator 104 and the clock source 106 may be synchronized, and may be, for example, phase-locked. The frequency of the clock signal 204 may be less than that of the signal 202. To capture a clear sine wave, the frequency of the signal 202 may be slightly larger than the frequency of the clock signal 204 multiplied by an integer. For example, the frequency of the clock signal 204 may be approximately 20 MHz, and the frequency of the signal 202 may be slightly larger than 100 MHz.

The overall jitter and the system noise cause the clock signal 204 and the signal 202 to fluctuate such that an attempted sampling of the maximum slew rate points 206a–c may result in actually sampling points 207a–c within a range 210 around the maximum slew rate points 206a–c. Since the slope is large around the maximum slew rate points 206a–c, deviations from the maximum slew rate points 206a–c cause a large variance in the measurements of the sine wave. Note that undersampling may be used to achieve a high slew rate. Undersampling occurs when frequency of an input signal is greater than one-half the sampling frequency. By using undersampling, the input frequency may be increased, thus increasing the slew rate, without increasing the sampling rate. A first measurement set 212 describes the measurements of the signal 202 at points sampled from within the range 210, and represents overall jitter and system noise.

In order to calculate overall jitter without system noise, the second measurement set 214 is generated by measuring the signal 202 at minimum slew rate points 208a–c. System noise, but not jitter, causes the deviations when sampling the minimum slew rate points 208a–c, resulting in a range 216 of sampled points. The deviations caused by the system noise result in a variance of the measurements of the minimum slew rate points 208a–c, which are represented by the second measurement set 214. The overall jitter may be computed from the variances of the first measurement set 212 and the second measurement set 214. The variances may be computed using any suitable method, for example, directly from the measurements, using histograms, or using fast Fourier transforms.

Figure 3:
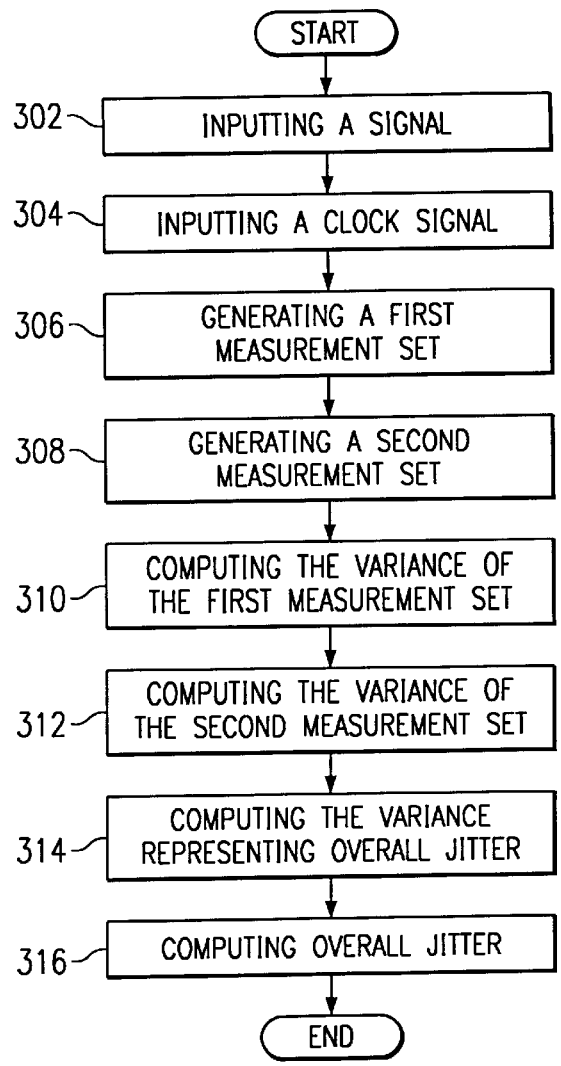
FIG. 3 is a flowchart demonstrating one embodiment of a method for measuring overall jitter in accordance with the present invention.

FIG. 3 is a flowchart demonstrating one embodiment of a method for measuring overall jitter in accordance with the present invention. In general, the method shown inputs the signal 202 and the clock signal 204 into the data converter 102. Using the clock signal 204, the data converter measures the signal 202 at the maximum slew rate points 206a–c to formulate the first measurement set 212 representing overall jitter and system noise. The data converter 102 measures the signal 202 at the minimum slew rate points 208a–c to formulate the second measurement set 214 representing system noise. The overall jitter is computed from the first measurement set 212 and the second measurement set 214.

Specifically, the method begins with step 302, where the signal 202 is input into the input 105 of the data converter 102. The signal 202 may be, for example, a sine wave signal generated by a sine wave generator. The signal 202 and the clock signal 204 may be synchronized with each other, and they may be, for example, phase-locked with each other. The frequency of the clock signal 204 may be less than that of the signal 202. For example, the frequency of the clock signal 204 may be approximately 20 MHz, and the frequency of the signal 204 may be approximately 100 MHz. In step 304, the clock signal 204 generated by the clock source 106 is sent to the clock 107 of the data converter 102.

The method then moves to step 306, where the first measurement set 212 representing overall jitter and system noise is generated. When attempting to sample the maximum slew rate points 206a–c, the overall jitter and system noise cause the clock signal 204 and the signal 202 to fluctuate and sample points within the range 210 around the maximum slew rate points 206a–c. Since the slope at the maximum slew rate points 206a–c is large, deviations around these points result in a large variance of the measurements of the signal 202. The variance of first measurement set 212 of the measurements around the maximum slew rate points 206a–c corresponds to the sum of the square of the system noise and the square of the overall jitter induced noise, from which the overall jitter and system noise can be computed. The variance may be computed from a histogram of the first measurement set 212, where the histogram is normalized to form $H_{max}(x)$. In step 308, the second measurement set 214 representing system noise is generated. System noise, but not overall jitter, causes deviations 216 when sampling of the minimum slew rate points 208a–c, resulting in a variance of the measurements of the signal 202. The variance of the second measurement set 214 of the measurements around the minimum (zero) slew rate points 208 corresponds to the square of the system noise. The variance may be computed from a histogram of the second measurement set 214, where the histogram is normalized to form $H_{min}(x)$.

In general, in steps 310–316, the overall jitter is computed from the variance of the normalized first histogram $H_{max}(x)$ and the variance of the normalized second histogram $H_{min}(x)$. Specifically, in step 310, the variance of $H_{max}(x)$ generated in step 306 may be computed either directly from the data set or by using Equation (4):

$$var_1 = \int (x-\bar{x}_1)^2 H_{max}(x) dx \tag{4}$$

where $$\bar{x}_1 = \int x H_{max}(x) dx$$

In step 312, the variance of $H_{min}(x)$ generated in step 308 may be computed either directly from the data set or by using Equation (5):

$$var_2 = \int (x-\bar{x}_2)^2 H_{min}(x) dx \tag{5}$$

where $$\bar{x}_2 = \int x H_{min}(x) dx$$

The variances of the first measurement set 212 and the second measurement set 214 may be computed using another suitable method, for example, computed directly from the measurement sets 212 and 214 or using fast Fourier transforms.

In step 314, the variance representing overall jitter is obtained by subtracting the variance representing system noise from the variance representing overall jitter and system noise, as shown by Equation (6):

$$var_j = var_1 - var_2 \tag{6}$$

In step 316, the overall jitter is computed from the variance representing overall jitter, as shown in Equation (7):

$$j_{overall} = \frac{1}{2\pi A f} \sqrt{var_j} \tag{7}$$

After computing the overall jitter, the method terminates.

Figure 4:
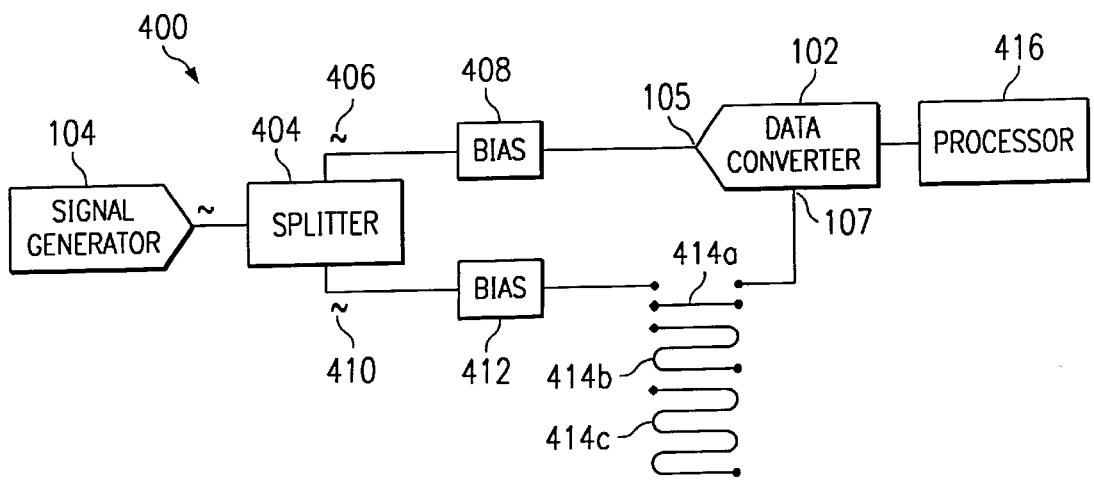
FIG. 4 is a block diagram of one embodiment of a system for measuring internal jitter that may be used in accordance with the present invention.

FIG. 4 is a block diagram of one embodiment of a system 400 for measuring internal jitter that may be used in accordance with the present invention. In general, the system 400 comprises an signal generator 104 coupled to a splitter 404 coupled to the data converter 102. Specifically, the signal generator 104 may be, for example, a low phase noise sine wave generator. The splitter 404, which may be, for example, a power splitter, splits the signal from the signal generator 104 into a splitter-input signal 406 and a splitter-clock signal 410. A splitter-input signal 406 of the splitter 404 may be biased using a first bias circuit 408 coupled to the splitter 404 and the data converter 102. The splitter-input signal 406 may be sent to the input 105 of the data converter 102. A splitter-clock signal 410 of the splitter 404 may be biased using a second bias circuit 412 coupled to the splitter 404 and the data converter 102. The splitter clock signal 410 may be sent to the clock 107 of the data converter 102. Since the signals to the input 105 and the clock 107 of the data converter are from the same source, any jitter in the source signal is present at both the clock and the input, canceling the jitter of the input and clock signals. The internal noise of the data converter 102 may be canceled by repeating the measurements under different phase conditions between the input and the clock, which may be obtained by varying the length of either the splitter-input signal 406 path or the splitter-clock signal 410 path. These paths may be varied by, for example, using traces 414a–c of different lengths, using relays to switch between the traces. A processor 416 may be used to compute the internal jitter of the data converter 102.

In general, when the clock and input frequencies are the same, the input is undersampled at twice the Nyquist frequency. If there were no noise or jitter, the output would be a straight direct current line at certain codes of the data converter. When jitter or noise is present, they can be measured from the data at the maximum and minimum slew rate points of the input signal. The data converter 102 is operable to generate a first data set by sampling the input signal at the maximum slew rate points of the input signal, and is operable to generate a second data set by sampling the input signal at the minimum slew rate points of the input signal. The internal jitter may then be computed from the first and the second data sets.

Figure 5A:
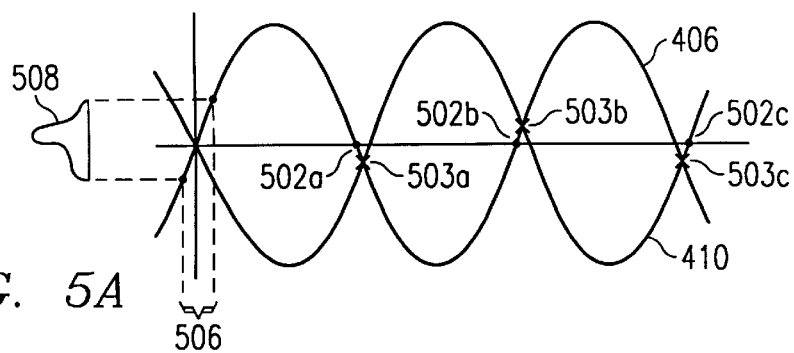
FIG. 5A is a graph illustrating a first data set generated in one embodiment of a method for measuring internal jitter in accordance with the present invention.

FIG. 5A is a graph illustrating a first data set generated in one embodiment of a method for measuring internal jitter in accordance with the present invention. The splitter-input signal 406 has maximum slew rate points 502a–c, which are the points of maximum slope of the splitter-input signal 406. Maximum slew rate points 502a–c are sampled by capturing data around the mid-code of the data converter 102. When attempting to sample the maximum slew rate points 502a–c, internal jitter and system noise cause the data converter 102 to fluctuate and to sample points 503a–c in a range 506 around the maximum slew rate points 502a–c, resulting in a variance in the measurements of the splitter-input signal 406. The variance of the first data set 508 of measurements of the points sampled around the maximum slew rate points 502 represents internal jitter and the data converter's 102 random noise.

Figure 5B:
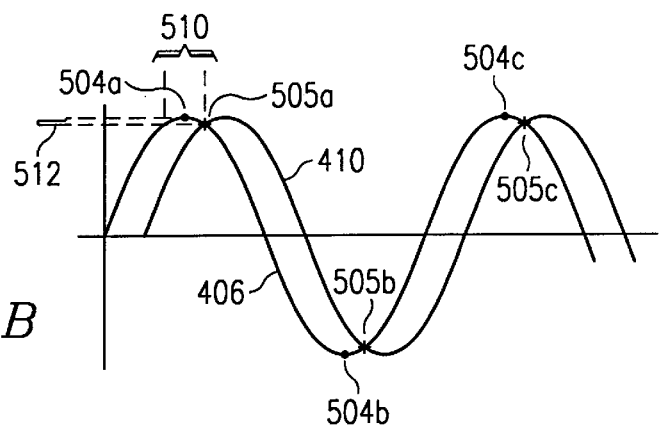
FIG. 5B is a graph illustrating a second data set generated in one embodiment of a method for measuring internal jitter in accordance with the present invention.

FIG. 5B is a graph illustrating a second data set generated in one embodiment of a method for measuring internal jitter in accordance with the present invention. The splitter-input signal 406 has minimum slew rate points 504a–c, which are the points of zero slope of the splitter-input signal 406. Minimum slew rate points 504a–c are sampled by capturing data around the zero-scale or full-scale codes of the data converter 102. System noise causes the data converter 102 to fluctuate when sampling the minimum slew rate points 504a–c and measure points 505a–c within a range 510 around the points 504a–c, resulting in a variance of measurements. The variance of the second data set 512 of measurements of points sampled around the minimum slew rate points 504a–c represents the system noise.

Figure 6:
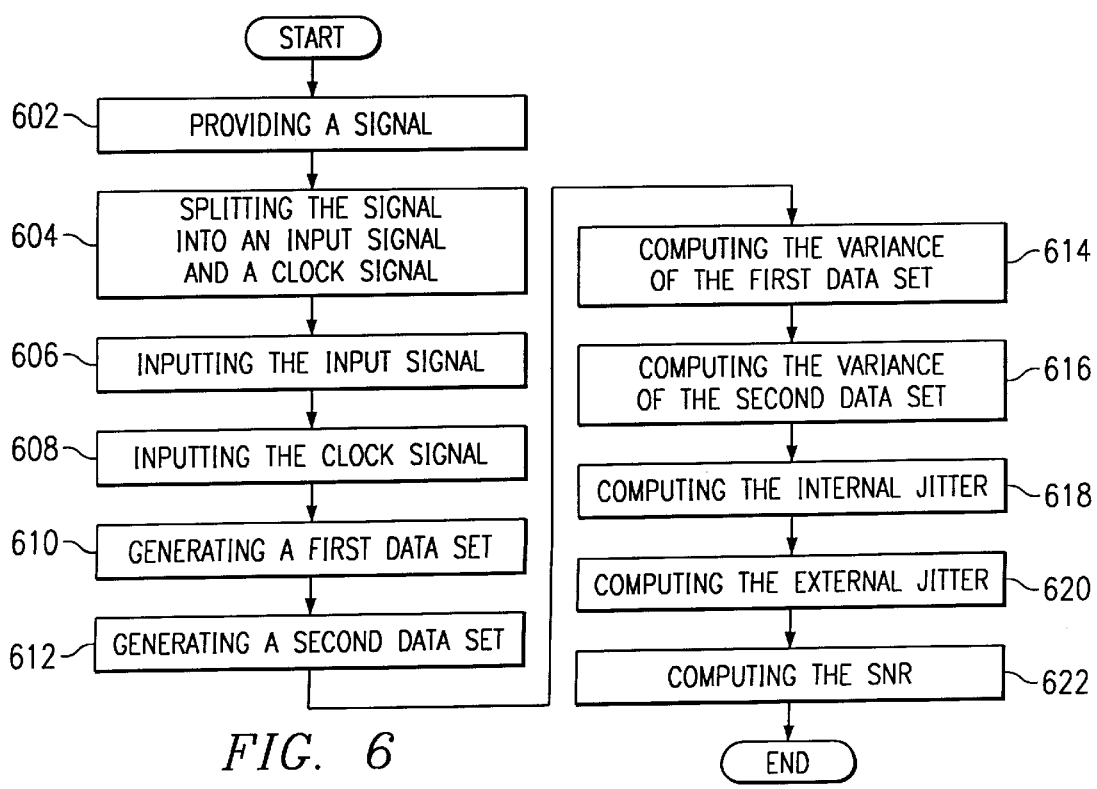
FIG. 6 is a flowchart demonstrating one embodiment of a method for measuring internal jitter in accordance with the present invention.

FIG. 6 is a flow chart demonstrating one embodiment of a method for measuring internal jitter in accordance with the present invention. In general, in this embodiment, the splitter 404 splits a signal, for example, a radio frequency signal, into a splitter-input signal 406 that is sent to the input 105 of the data converter 102, and splitter-clock signal 410 that is sent to the clock 107 of the data converter 102. The data converter 102 samples the maximum slew rate points 502a–c of the splitter-input signal 406 to generate the first data set 508 representing internal jitter and system noise. The data converter 102 samples the minimum slew rate points 510 of the input signal 406 in order to generate the second data set 512 representing system noise. The internal jitter is computed from the first data set 508 and the second data set 512. The external jitter is computed from the overall jitter and the internal jitter. Finally, the signal-to-noise-ratio (SNR) is computed from the external jitter.

Specifically, the method begins with step 602, where a signal is provided. The signal may be provided using, for example, using the signal generator 402. In step 604, the signal is split using the splitter 404 into the splitter-input signal 406 and the splitter-clock signal 410. The input signal has maximum slew rate points 502*a–c* and minimum slew rate points 504*a–c*. In step 606, the splitter-input signal 406 is input into the input 105 of the data converter 102. In step 608, the clock signal 410 is input into the clock 107 of the data converter 102.

The method proceeds to step 610, where the first data set 508 is generated. When attempting to sample the maximum slew rate points 502*a–c*, internal jitter and system noise cause the data converter 102 to sample points in the range 506 around the points 502*a–c*, which causes a variance in the measurements of the splitter-input signal 406. The variance of the histogram of the first data set 508 of measurements around the maximum slew rate points represents internal jitter and system noise. To measure the maximum slew rate points 502*a–c*, the path lengths of the splitter input 406 and the splitter-clock 410 signals are varied until the measured data is around the mid-scale code of the data converter 102. In step 612, the second data set 512 is generated. System noise causes deviations when sampling the minimum slew rate points 504*a–c*, which results in a variance in the measurements of the splitter-input signal 406 around the minimum slew rate points 504*a–c*. The variance of the histogram of the second data set 512 of measurements represents system noise. To sample the minimum slew rate points 405*a–c*, the path lengths of the splitter input 406 and the splitter-clock 410 signals may be varied, for example, using traces 414*a–c*, until the measured data is around the zero-scale or full-scale codes of the data converter 102.

In general, in steps 614 through 618, the internal jitter is calculated from the variance of the first data set 508 generated in step 610 and the variance of the second data set 512 generated in step 612. Specifically, in step 614, the variance $var_1$ of the first data set 508 is computed. The variance may be computed, for example, by directly computing the variance from the data. Other appropriate alternatives may be used, for example, computing the variance from a histogram or a Fourier transform of the data set. In step 616, the variance $var_2$ of the second data set 512 is computed. As in step 614, variance $var_2$ may be computed, for example, directly from the data or from a histogram or a Fourier transform of the data set.

In step 618, the internal jitter is computed using Equation (8):

$$j_{internal} = \frac{1}{2\pi} \sqrt{\frac{var_1 - var_2}{[(f_1 A_1 \cos(\theta_1))^2 - (f_2 A_2 \cos(\theta_2))^2]}} \quad (8)$$

$f_1$ is the frequency of the signal of the first data set;
$f_2$ is the frequency of the signal of the second data set;
$A_1$ is the amplitude of the signal of the first data set;
$A_2$ is the amplitude of the signal of the second data set;
$output_1$ is the average value of the measured outputs from the first data set;
$output_2$ is the average value of the measured outputs from the second data set.

$$\theta_1 = \arcsin\left(\frac{2 * output_1}{A_1}\right); \text{ and}$$

$$\theta_2 = \arcsin\left(\frac{2 * output_2}{A_2}\right)$$

Note that the measurements may be taken such that $f_1=f_2$ and $A_1=A_2$, and the path lengths for the splitter clock 406 and the splitter input 410 signals are different. Note also that any amplitude, frequency or phase may be used in the above formulas.

The accuracy of the measurement depends on the size of the following value:

$$[(f_1 A_1 \cos(\theta_1))^2 - (f_2 A_2 \cos(\theta_2))^2]$$

If the value is sufficiently large, the measurement will be more accurate. While known approaches have an accuracy of approximately 10 ps rms, this embodiment of the method of measuring jitter has an accuracy of approximately 0.1 ps rms.

In step 620, the external jitter is calculated from the internal jitter determined in step 614 and the overall jitter. Assuming no correlation between the noise sources, the external jitter is given by Equation (9):

$$j_{external} = \sqrt{j_{overall}^2 - j_{internal}^2} \quad (9)$$

Also, the external jitter induced noise is given by Equation (10):

$$n_{j,external} = \sqrt{2}\pi A f_{in} j_{external} \quad (10)$$

where 'A' is the input amplitude and 'f' is the input frequency.

Finally, in step 622, the SNR is calculated from the external jitter from step 620. The SNR is calculated by calibrating out the effects of the external jitter. The true SNR of the data converter 102 is given by Equation (11):

$$SNR_{true} = 10\log\left(\frac{A^2/2}{N^2 - n_{j,external}^2}\right) \quad (11)$$

While a known method may estimate the SNR of a 12 bit 66 MSPS communication ADC at a frequency of 16 MHz to be approximately 58 dBs, applying the method of jitter correction to the calculation of the SNR of the same ADC may yield an SNR value of approximately 63 dBs A technical advantage of the present invention is that, unlike the measurements of known approaches, the calculation of overall jitter and internal jitter does not include system noise, resulting in a more accurate assessment of jitter, approximately 0.1 ps rms accuracy. The exclusion of system noise also results in more accurate assessment of signal-to-noise ratio. Another technical advantage of the present invention is that it does not require jitterless components to determine the overall jitter and internal jitter of a data converter. Practically jitterless components are often expensive and fail to meet the requirements needed to measure the jitter of a communications data converter. Therefore, the present invention allows for a more accessible, more accurate calculation of jitter, resulting in a more accurate test of a data converter.

Although an embodiment of the invention and its advantages are described in detail, a person skilled in the art could make various alternations, additions, and omissions without departing from the spirit and scope of the present invention as defined by the appended claims.

What is claimed is:

1. A system for measuring jitter, the system comprising:
a signal generator operable to output a signal;
a data converter coupled to the signal generator, and operable to periodically measure the signal near maximum slew rate points of the signal to generate a first measurement set and to periodically measure the signal near minimum slew rate points of the signal to generate a second measurement set; and circuitry coupled to the data converter, for computing a measurement of jitter using the first measurement set and the second measurement set.

2. The system of claim 1 wherein the data converter is an analog-to-digital converter.

3. The system of claim 1 wherein the signal generator is a sine wave generator.

4. The system of claim 1 wherein the signal generator is a square wave generator.

5. The system of claim 1 further comprising a clock source coupled to the data converter, wherein the clock source is operable to output a clock signal to the data converter and is synchronized with the signal generator.

6. The system of claim 1 further comprising a clock source coupled to the data converter, wherein the clock source is operable to output a clock signal to the data converter and is phase locked with the signal generator.

7. The system of claim 1 wherein:
the variance of the first measurement set represents overall jitter and system noise;
the variance of the second measurement set represents system noise; and
the overall jitter is computable using the variance of the second measurement set and the variance of the first measurement set.

8. A method for measuring jitter, the method comprising:
inputting a signal into a data converter;
generating a first measurement set by periodically measuring the signal near its maximum slew rate points using the data converter;
generating a second measurement set by periodically measuring the signal near its minimum slew rate points using the data converter; and
computing the jitter using the first measurement set and the second measurement set.

9. The method of claim 8 wherein the data converter is an analog-to-digital converter.

10. The method of claim 8 wherein the signal is a sine wave.

11. The method of claim 8 further comprising inputting a clock signal into the data converter, wherein the clock signal is synchronized with the signal.

12. The method of claim 8 further comprising inputting a clock signal into the data converter, wherein the clock signal is phase-locked with the signal.

13. The method of claim 8 wherein the step of computing comprises:
computing the variance of the first measurement set, wherein the variance of the first measurement set represents overall jitter and system noise;
computing the variance of the second measurement set, wherein the variance of the second measurement set represents system noise; and
computing the overall jitter using the variance of the second measurement set and the variance of the first measurement set.

14. The method of claim 8 wherein the step of computing comprises:
computing the variance of the first measurement set using a first histogram of the first measurement set, wherein the variance of the first measurement set represents overall jitter and system noise;
computing the variance of the second measurement set using a second histogram of the second measurement set, wherein the variance of the second measurement set represents system noise; and
computing the overall jitter using the variance of the second measurement set and the variance of the first measurement set.

15. The method of claim 8 wherein the step of computing comprises:
computing the variance of the first measurement set using a Fourier transform of the first measurement set, wherein the variance of the first measurement set represents overall jitter and system noise;
computing the variance of the second measurement set using a Fourier transform of the second measurement set, wherein the variance of the second measurement set represents system noise; and
computing the overall jitter using the variance of the second measurement set and the variance of the first measurement set.

16. A system for measuring jitter, the system comprising:
a signal generator operable to generate a signal;
a splitter coupled to the signal generator and operable to split the signal into an input signal and a clock signal;
a data converter coupled to the splitter and operable to periodically measure the input signal near its maximum slew rate points using the clock signal to generate a first data set and to periodically measure the input signal using the clock signal near its minimum slew rate points to generate a second data set; and
circuitry, coupled to the data converter, for computing the jitter using the first data set and the second data set.

17. The system of claim 11 wherein the data converter is an analog-to-digital converter.

18. The system of claim 11 wherein the signal generator is a sine wave generator.

19. The system of claim 11 wherein the signal generator is a square wave generator.

20. The system of claim 16 wherein:
the variance of the first data set represents internal jitter and system noise;
the variance of the second data set represents system noise; and
the internal jitter is computable using the variance of the second data set and the variance of the first data set.

21. A method for measuring external jitter, the method comprising:
measuring the overall jitter by:
inputting a signal into a data converter;
generating a first measurement set representing overall jitter and system noise by measuring the signal using the data converter;
generating a second measurement set representing system noise by measuring the signal using the data converter; and
computing the overall jitter using the first measurement set and the second measurement set;
measuring the internal jitter by:
providing a signal;
splitting the signal into an input signal and a clock signal;
inputting the input signal into a data converter;
providing the clock signal into the data converter;
generating a first data set representing internal jitter and system noise;
generating a second data set representing system noise; and computing the external jitter using the first data set and the second data set; and calculating the external jitter using the overall jitter and the internal jitter.

22. A method for measuring signal-to-noise ratio, the method comprising:

measuring the overall jitter by:
  inputting a signal into a data converter;
  generating a first measurement set representing overall jitter and system noise by measuring the signal using the data converter;
  generating a second measurement set representing system noise by measuring the signal using the data converter; and
  computing the overall jitter using the first measurement set and the second measurement set;

measuring the internal jitter by:
  providing a signal;
  splitting the signal into an input signal and a clock signal;
  inputting the input signal into a data converter;
  providing the clock signal into the data converter;
  generating a first data set representing internal jitter and system noise;
  generating a second data set representing system noise; and
  computing the external jitter using the first data set and the second data set;

calculating the external jitter using the overall jitter and the internal jitter; and calculating the signal-to-noise ratio using the external jitter.

* * * * *